(12) United States Patent
Kim

(10) Patent No.: US 7,262,097 B2
(45) Date of Patent: Aug. 28, 2007

(54) METHOD FOR FORMING FLOATING GATE IN FLASH MEMORY DEVICE

(75) Inventor: Heong Jin Kim, Chilgok-gun (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/320,592

(22) Filed: Dec. 30, 2005

(65) Prior Publication Data

US 2007/0026607 A1  Feb. 1, 2007

(30) Foreign Application Priority Data

Jul. 28, 2005  (KR) .................. 10-2005-0068730

(51) Int. Cl.
  *H01L 21/8247*  (2006.01)
(52) U.S. Cl. .................. 438/257; 257/E21.179; 438/296
(58) Field of Classification Search ........ 438/257–267, 438/296; 257/E21.179
  See application file for complete search history.

(56) References Cited

U.S. PATENT DOCUMENTS 4,544,576 A * 10/1985 Chu et al. .................. 438/438
5,851,899 A * 12/1998 Weigand .................... 438/427
6,869,849 B2 * 3/2005 Kanamori .................. 438/296
7,037,787 B2 * 5/2006 Fan et al. ................... 438/267

* cited by examiner

*Primary Examiner*—Richard A. Booth
(74) *Attorney, Agent, or Firm*—Lowe Hauptman & Berner LLP

(57) ABSTRACT

A method for fabricating a nonvolatile memory device including successively forming a first oxide layer, an electrically conductive layer, a second oxide layer, a nitride layer and a third oxide layer on a semiconductor substrate. The method also includes patterning the third oxide layer, forming spacers at sidewalls of the third oxide layer, forming a trench in the substrate by selectively etching the substrate with the third oxide layer as a mask, filling the trench with fourth oxide layer, and removing the third oxide layer, the nitride layer and the second oxide layer. Before filling the trench with the fourth oxide layer, a liner oxide layer is formed on inner walls of the trench. The fourth oxide layer is high density plasma (HDP) oxide and tetrafluoroethane $(Si(OC_2H_5)_4)$. During the filling the trench, lower corners of the conductive layer are made have rounded structure or bird's beak structure.

4 Claims, 4 Drawing Sheets

METHOD FOR FORMING FLOATING GATE IN FLASH MEMORY DEVICE

This application claims the benefit of Korean Application No. 10-2005-0068730, filed on Jul. 28, 2005, which is hereby incorporated by reference in its entirety.

BACKGROUND OF THE INVENTION

1. Field of the Invention

The present invention relates to semiconductor memory device technology. More specifically, the present invention relates to a method for forming a floating gate in flash nonvolatile memory devices.

2. Description of the Related Art

Flash memory is widely used and known as a strong competitor to other nonvolatile memory devices, such as EPROMs and EEPROMs, and to some DRAM applications. The flash memory is capable of retaining the stored data without continued supply of electrical power, and typically has a stacked gate structure of a floating gate and a control gate. The floating gate, which is placed between the control gate and the semiconductor substrate, is isolated by a tunnel oxide layer. Electrons trapped into the floating gate modify the threshold voltage of the transistor. Electrons are trapped in the floating gate by Fowler-Nordheim tunneling or hot electron injection (HCI) through the tunnel oxide. Electrons are removed or erased from the floating gate by Fowler-Nordheim tunneling.

FIG. 1 is a cross-sectional view of a floating gate in conventional flash memory cell.

Referring to FIG. 1, the floating gate 13 is formed on a semiconductor substrate 10, which is interposed by a tunnel oxide layer 12. In the semiconductor substrate 10, an isolation layer 11 made by shallow trench isolation (STI) technique is formed. The isolation 10 defines active regions where microcircuit elements such as memory cells are to be formed. The STI isolation has been developed to replace the traditional local oxidation of silicon (LOCOS) isolation according to demands of miniaturization of integrated circuit devices.

When the floating gate is formed by using the STI technique, oxide thinning problem in interfaces between the active and isolation regions is inevitable. The oxide thinning causes an increase of leakage current to degrade the programming and reading characteristics of the memory devices.

SUMMARY OF THE INVENTION

It is, therefore, an object of the present invention to provide a method for forming a floating gate that can overcome the problems of the conventional flash memory devices.

Another object of the present invention is to improve the reliability of the flash memory device by ensuring stable electrical characteristics thereof.

To achieve the above objects, the present invention employs semi-recessed LOCOS process to the isolation of the flash memory cells.

In an aspect of the present invention, a method for fabricating a nonvolatile memory device comprises the steps of: successively forming a first oxide layer, an electrically conductive layer, a second oxide layer, a nitride layer and a third oxide layer on a semiconductor substrate; patterning the third oxide layer; forming spacers at sidewalls of the third oxide layer; forming a trench in the substrate by selectively etching the substrate with the third oxide layer as a mask; filling the trench with fourth oxide layer; and removing the third oxide layer, the nitride layer and the second oxide layer.

Before filling the trench with the fourth oxide layer, a liner oxide layer is formed on inner walls of the trench. The fourth oxide layer is high density plasma (HDP) oxide and tetrafluoroethane ($Si(OC_2H_5)_4$).

During the filling the trench, lower corners of the conductive layer are made have rounded structure or bird's beak structure. The removal of the third oxide layer, the nitride layer and the second oxide layer is performed by chemical mechanical polishing (CMP) process.

These and other aspects of the invention will become evident by reference to the following description of the invention, often referring to the accompanying drawings.

DETAILED DESCRIPTION OF THE INVENTION

Hereinafter, embodiments of a nonvolatile memory device and fabrication method thereof, according to the present invention, will be described with reference to FIGS. 4 to 6.

FIGS. 2 to 7 are cross-sectional views for illustrating a method for forming a floating gate in flash memory cells according to the present invention.

Figure 1:
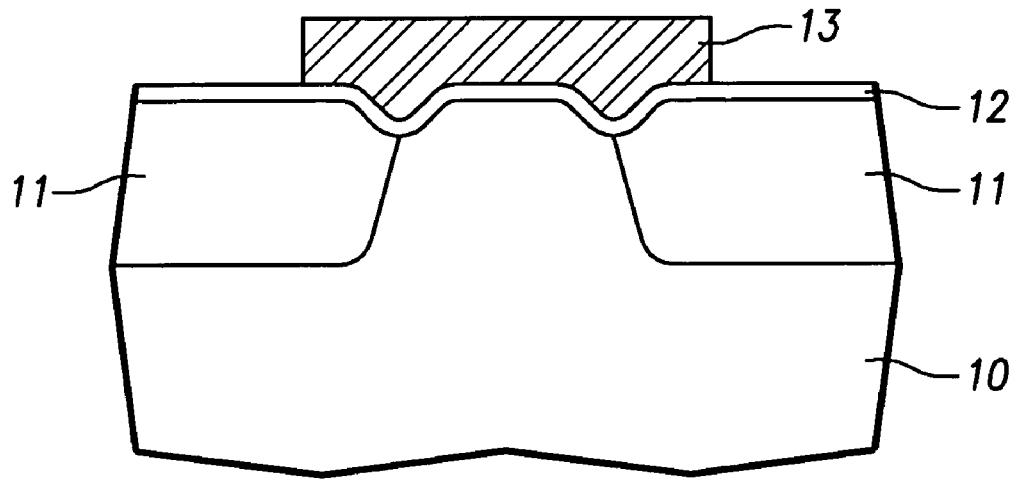
FIG. 1 is a cross-sectional view of a floating gate in conventional flash memory cell.
Figure 2:
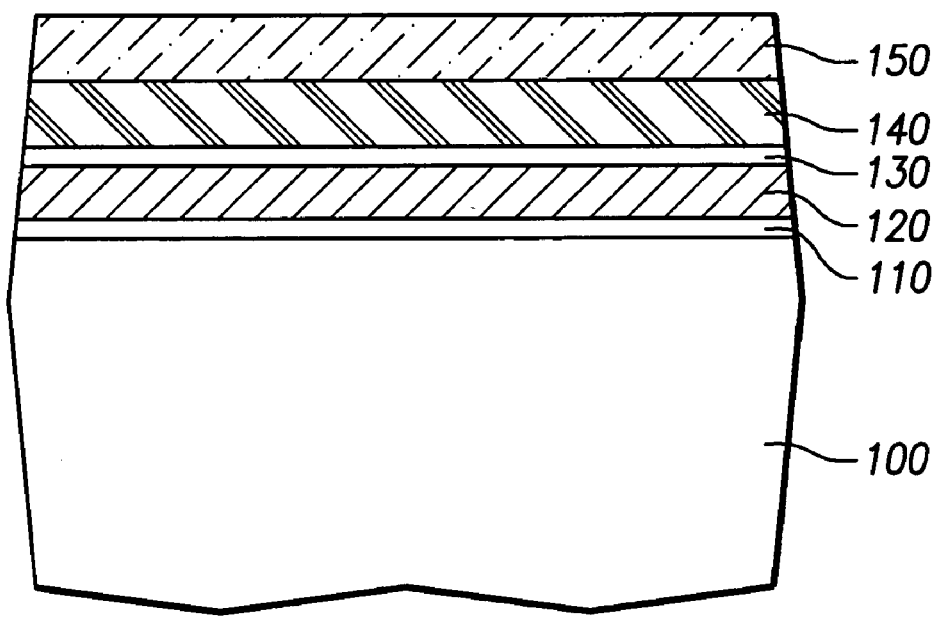
FIGS. 2 to 7 are cross-sectional views for illustrating a method for forming a floating gate in flash memory cells according to the present invention.

Referring to FIG. 2, a first oxide layer 110 is formed on a semiconductor substrate 100 that is made of e.g., silicon. The first oxide layer 110 is a tunnel oxide film. Though not shown in FIG. 2, conventional processes, for instance well forming process by an ion implantation after forming a buffer oxide layer on the substrate, photolithographic process and removal step of the buffer oxide layer, and an ion implantation for the control of threshold voltage can be performed before the formation of the tunnel oxide layer 110 on the substrate 100.

Subsequently, electrically conductive material 120 is deposited on the tunnel oxide layer 110. Then, a second oxide layer 130 (sacrificial oxide layer), a nitride layer 140, and a third oxide layer 150 (cap oxide layer) are successively deposited on the conductive material 120. After depositing the conductive material 120, dopants can be injected or diffused into the conductive material 120.

Figure 3:
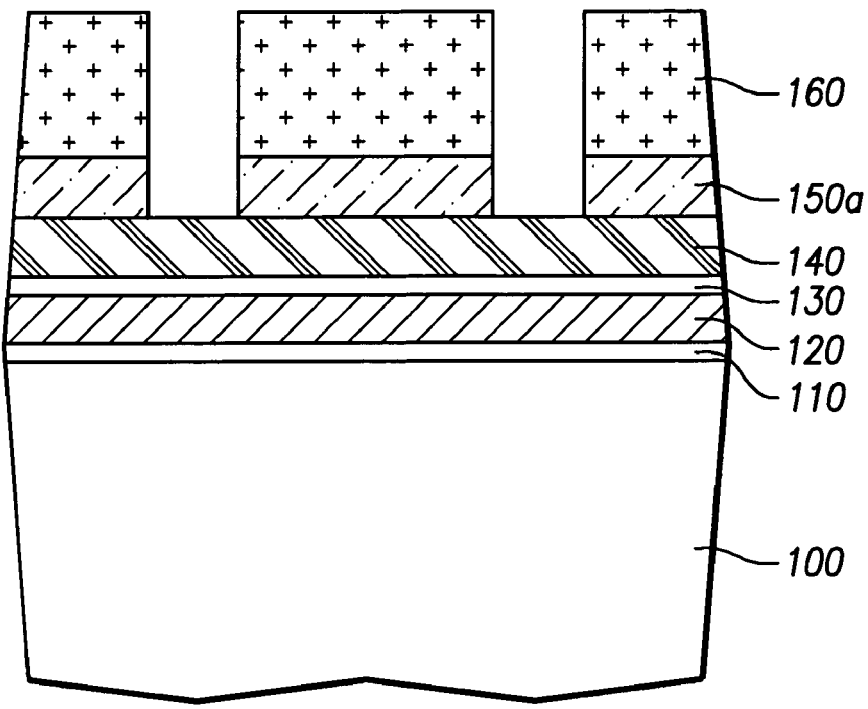

Referring to FIG. 3, a first photoresist pattern 160 is formed on the cap oxide layer 150 to define active regions. The cap oxide layer 150 is selectively etched with the first photoresist pattern 160 as an etch mask to form a cap oxide layer pattern 150a. The formation of the first photoresist pattern 160 can be carried out by conventional photolithographic process, and the selective etching of the cap oxide layer 150 is done by reactive ion etching (RIE) technique.

Figure 4:
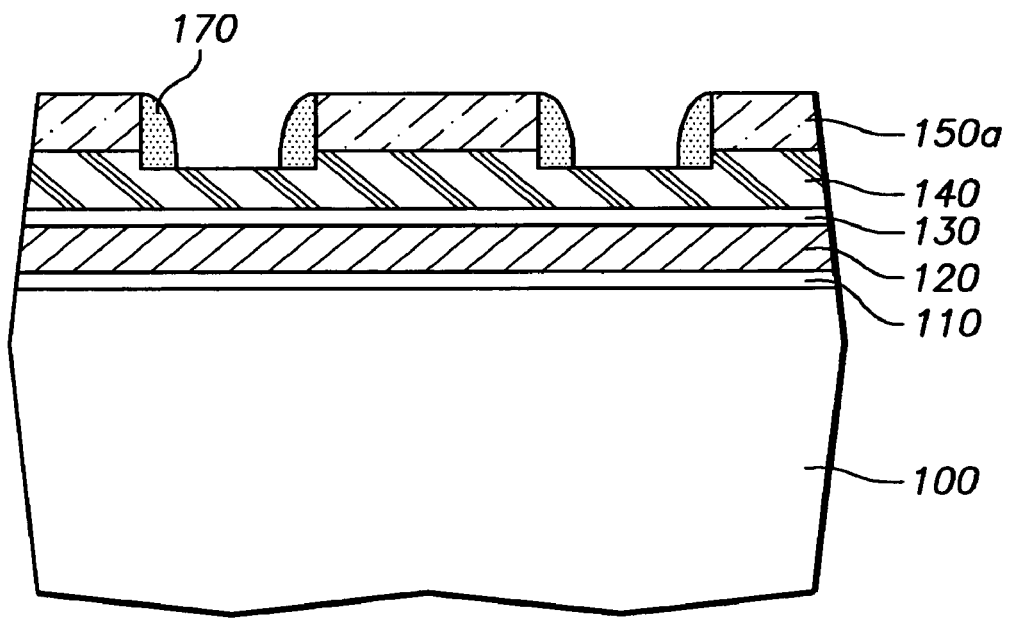

Referring to FIG. 4, spacer oxide layers 170 are formed at both sides of the cap oxide layer pattern 150a. When the active region is obtained by the spacer oxide layers 170, current characteristics of flash memory cells are enhanced. Further, the spacer oxide layers 170 have advantages in process margins. The formation of the spacer oxide layers can include deposition of oxide layer and RIE process. After forming the spacer oxide layers, typical cleaning process is undergone.

Figure 5:
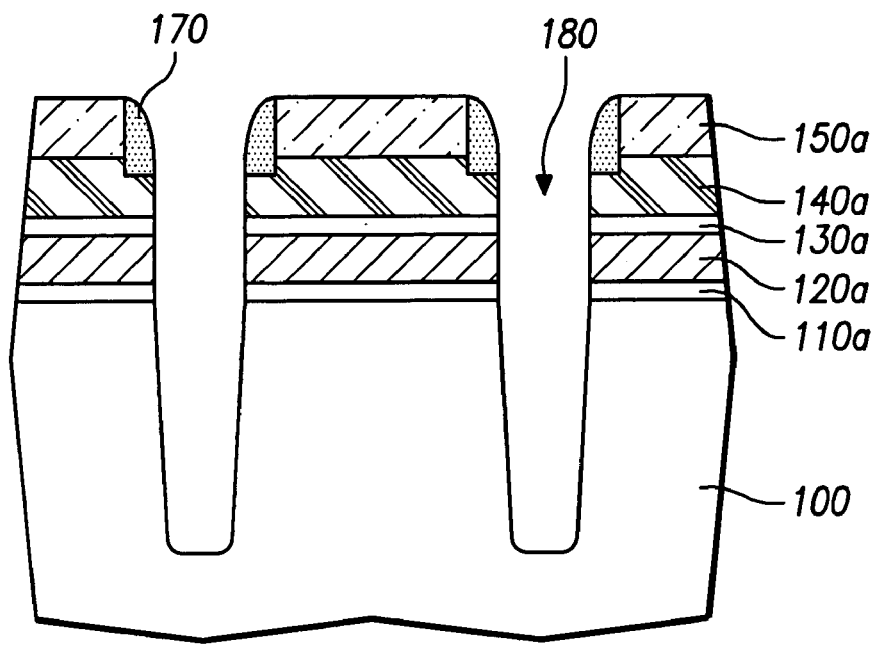

Referring to FIG. 5, the nitride layer 140, conductive layer 130, tunnel oxide layer 120 and the substrate 100 are selectively removed by e.g., RIE, with the cap oxide layer pattern 150a including the spacer oxide layers 170 as an etch mask, to form a nitride pattern 140a, a sacrificial oxide pattern 130a, conductive pattern 120a, and tunnel oxide pattern 110a on the substrate 100. Further, a trench 180 having a predetermined depth is formed in the substrate 100 through the photo-etching process. When the trench 180 is formed, typical cleaning process can be included.

Figure 6:
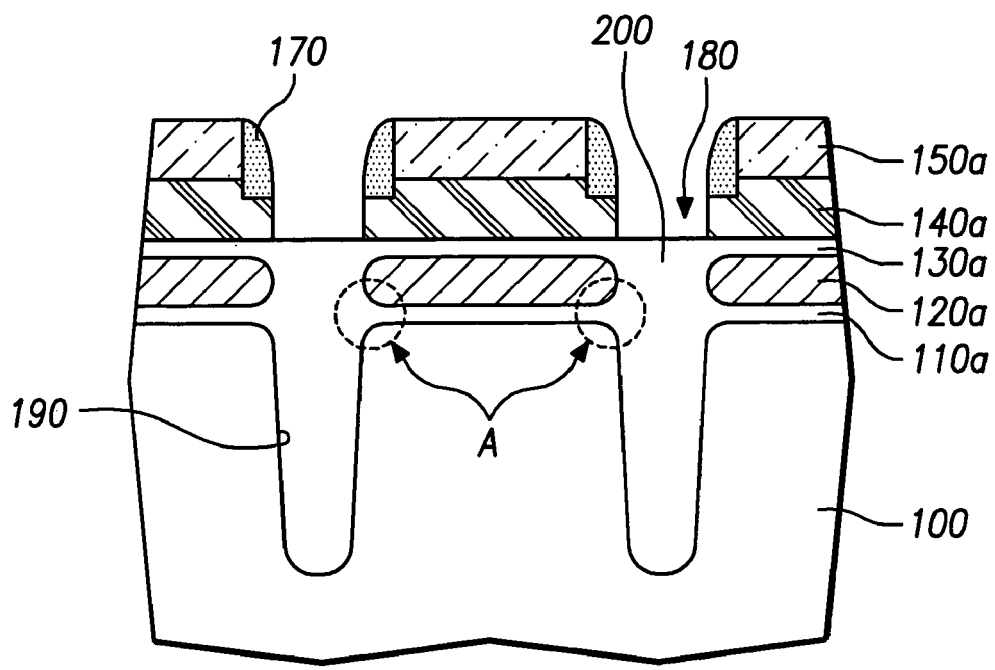

Referring to FIG. 6, a liner oxide layer 190 is grown within the trench 180 by e.g., a field oxidation process after the formation of the trench 180. Subsequently, a so-called semi-recessed LOCOS step is performed to fill the trench 180 with insulating material. The trench fill material (fourth oxide layer 200) includes high density plasma (HDP) oxide and tetrafluoroethane ($Si(OC_2H_5)_4$). The fourth oxide layer 200 filling the trench becomes an isolation layer in subsequent processes.

According to this semi-recessed LOCOS process, the fourth oxide layer 200 has thicker portions at corners of the conductive pattern 120a. Further, lower corners "A" of the conductive pattern 120a have rounded structure. In other words, the fourth oxide layer 200 is grown relatively thicker at the lower corners "A" to form a bird's beak shape. Therefore, in the present invention, the oxide thinning problem of the tunnel oxide 110a does not occur at the interfaces between the active and isolation regions.

Figure 7:
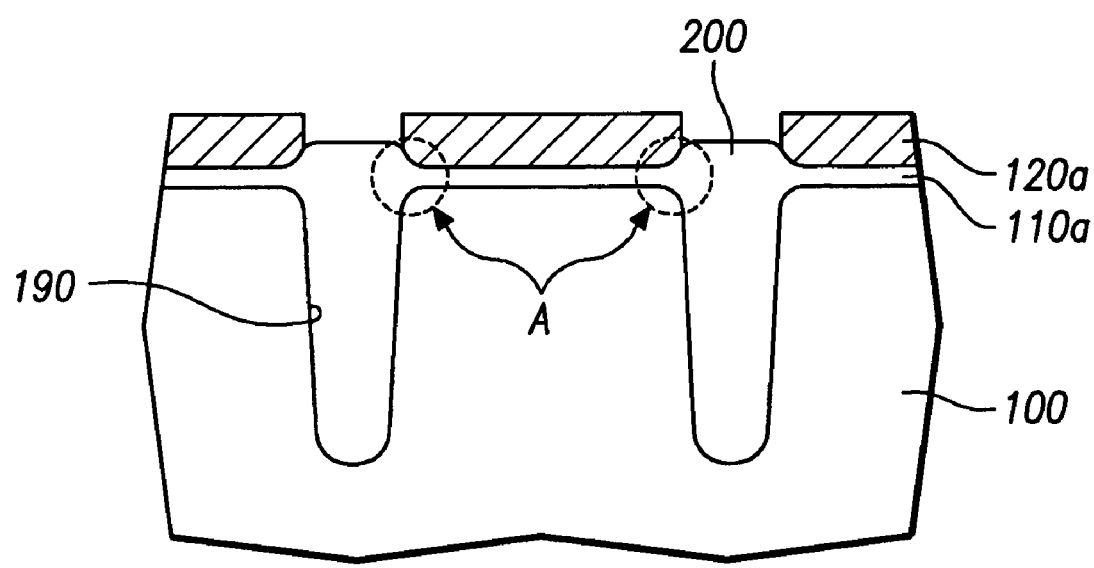

Referring to FIG. 7, the cap oxide pattern 150a, nitride pattern 140a and sacrificial oxide pattern 130a are removed to leave the conductive pattern 120a. In this process, chemical mechanical polishing (CMP) or other techniques can be used.

Through the processes explained above, a floating gate 120a having bird's beak shaped trench fill oxide is obtained.

According to the present invention, electrical characteristics of flash memory cells are greatly enhanced and unit memory block size is reduced. Further, the conventional two processing steps for the floating gate are reduced to a single step. Moreover, since the active region can be obtained by the spacers, processing margin and cell current characteristics are improved. In addition, various coupling ratio is possible by the gate bird's beak.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for fabricating a nonvolatile memory device, said method comprising the steps of:
    successively forming a first oxide layer, an electrically conductive layer, a second oxide layer, a nitride layer and a third oxide layer on a semiconductor substrate;
    patterning the third oxide layer;
    forming spacers at sidewalls of third oxide layer;
    forming a trench in the substrate by selectively etching the substrate with the third oxide layer as mask;
    forming a liner oxide on inner walls of the trench;
    filling the trench with a fourth oxide layer using a semi-recessed LOCOS process, while making lower corners of the conductive layer to have rounded structure, the fourth oxide layer functioning as an isolation layer; and
    removing the third oxide layer, the nitride layer and the second oxide layer.

2. The method of claim 1, wherein the step of removing the third oxide layer, the nitride layer and the second oxide layer is performed by chemical mechanical polishing (CMP) process.

3. The method of claim 1, wherein the step of forming the trench is carried out by reactive ion etching.

4. The method of claim 1, wherein the fourth oxide layer is made of high density plasma (HDP) oxide or tetrafluoroethane ($Si(OC_2H_5)_4$).

* * * * *